United States Patent
Coe-Sullivan et al.

(10) Patent No.: US 9,006,753 B2
(45) Date of Patent: Apr. 14, 2015

(54) ELECTROLUMINESCENT DISPLAY USEFUL FOR DISPLAYING A PREDETERMINED PATTERN

(75) Inventors: Seth Coe-Sullivan, Belmont, MA (US); Gregory V. Moeller, Ashland, MA (US); Joseph Carr, Chapel Hill, NC (US)

(73) Assignee: QD Vision, Inc., Lexington, MA (US)

( * ) Notice: Subject to any disclaimer, the term of this patent is extended or adjusted under 35 U.S.C. 154(b) by 362 days.

(21) Appl. No.: 12/381,530

(22) Filed: Mar. 12, 2009

(65) Prior Publication Data
US 2009/0283778 A1    Nov. 19, 2009

Related U.S. Application Data

(63) Continuation of application No. PCT/US2007/019796, filed on Sep. 12, 2007.

(60) Provisional application No. 60/825,370, filed on Sep. 12, 2006.

(51) Int. Cl.
| | | |
|---|---|---|
| H01L 33/00 | (2010.01) | |
| H01L 51/50 | (2006.01) | |
| B82Y 20/00 | (2011.01) | |
| B82Y 30/00 | (2011.01) | |

(52) U.S. Cl.
CPC ............ *H01L 51/5012* (2013.01); *B82Y 20/00* (2013.01); *B82Y 30/00* (2013.01); *H01L 51/5036* (2013.01)

(58) Field of Classification Search
USPC ...... 257/88, E33.061; 252/301.4 R; 313/503; 548/101; 556/118
See application file for complete search history.

(56) References Cited

U.S. PATENT DOCUMENTS

| | | |
|---|---|---|
| 5,200,668 A | 4/1993 | Ohashi et al. |
| 5,238,607 A | 8/1993 | Herron et al. |
| 5,244,828 A | 9/1993 | Okada et al. |
| 5,281,543 A | 1/1994 | Fukuzawa et al. |
| 5,442,254 A | 8/1995 | Jaskie |
| 5,537,000 A | 7/1996 | Alivisatos et al. |
| 5,578,379 A | 11/1996 | Stutzmann et al. |
| 5,586,879 A | 12/1996 | Szpak |
| 5,607,876 A | 3/1997 | Biegelsen et al. |
| 5,663,573 A | 9/1997 | Epstein et al. |
| 5,766,779 A | 6/1998 | Shi et al. |

(Continued)

FOREIGN PATENT DOCUMENTS

| | | |
|---|---|---|
| EP | 1369923 | 12/2003 |
| EP | 1681734 | 7/2006 |

(Continued)

OTHER PUBLICATIONS

Office Action, mailed Feb. 14, 2012, in counterpart Japanese Patent Application No. 2009-528269.

(Continued)

*Primary Examiner* — Long Pham (57) ABSTRACT

An electroluminescent display comprising semiconductor nanocrystals, wherein the semiconductor nanocrystals are selected to emit light at a predetermined wavelength and are disposed in a predetermined pattern. In certain embodiments, semiconductor nanocrystals that emit light at different predetermined wavelengths are disposed in the display to create a predetermined multi-color pattern.

18 Claims, 2 Drawing Sheets

(56) References Cited

U.S. PATENT DOCUMENTS

| | | |
|---|---|---|
| 5,783,292 A | 7/1998 | Tokito et al. |
| 5,866,039 A | 2/1999 | Morton |
| 5,874,803 A | 2/1999 | Garbuzov et al. |
| 5,882,779 A | 3/1999 | Lawandy |
| 5,917,279 A | 6/1999 | Elschner et al. |
| 6,027,958 A | 2/2000 | Vu et al. |
| 6,129,986 A | 10/2000 | Bessho et al. |
| 6,157,047 A | 12/2000 | Fujita et al. |
| 6,194,237 B1 | 2/2001 | Kim et al. |
| 6,207,229 B1 | 3/2001 | Bawendi et al. |
| 6,239,355 B1 | 5/2001 | Salafsky |
| 6,242,076 B1 | 6/2001 | Andriash |
| 6,249,372 B1 | 6/2001 | Kobayashi et al. |
| 6,322,901 B1 | 11/2001 | Bawendi et al. |
| 6,464,898 B1 | 10/2002 | Tomoike |
| 6,512,172 B1 | 1/2003 | Salafsky et al. |
| 6,515,314 B1 | 2/2003 | Duggal et al. |
| 6,518,603 B1 | 2/2003 | Schmuki et al. |
| 6,544,808 B2 | 4/2003 | Hoon |
| 6,544,870 B2 | 4/2003 | Park et al. |
| 6,576,291 B2 | 6/2003 | Bawendi et al. |
| 6,579,422 B1 | 6/2003 | Kakinuma |
| 6,586,785 B2 | 7/2003 | Flagan et al. |
| 6,608,439 B1 | 8/2003 | Sokolik et al. |
| 6,697,403 B2 | 2/2004 | Lee et al. |
| 6,703,781 B2 | 3/2004 | Zovko |
| 6,706,551 B2 | 3/2004 | Andriessen |
| 6,710,366 B1 | 3/2004 | Lee et al. |
| 6,710,836 B2 | 3/2004 | Lee et al. |
| 6,720,942 B2 | 4/2004 | Lee et al. |
| 6,753,272 B1 | 6/2004 | Lee et al. |
| 6,753,273 B2 | 6/2004 | Holonyak, Jr. et al. |
| 6,777,706 B1 | 8/2004 | Tessler et al. |
| 6,797,412 B1 | 9/2004 | Jain et al. |
| 6,803,719 B1 | 10/2004 | Miller et al. |
| 6,815,064 B2 | 11/2004 | Treadway et al. |
| 6,853,013 B2 | 2/2005 | Hirai et al. |
| 6,859,477 B2 | 2/2005 | Deppe et al. |
| 6,861,155 B2 | 3/2005 | Bawendi et al. |
| 6,861,674 B2 | 3/2005 | Perlo et al. |
| 6,940,087 B2 | 9/2005 | Komoda et al. |
| 6,949,879 B1 | 9/2005 | Wright et al. |
| 6,955,856 B2 | 10/2005 | Lee et al. |
| 6,995,505 B2 | 2/2006 | Kim et al. |
| 7,015,139 B2 | 3/2006 | Yamashita |
| 7,015,498 B2 | 3/2006 | Ebe et al. |
| 7,015,640 B2 | 3/2006 | Schaepkens et al. |
| 7,147,712 B2 | 12/2006 | Zehnder et al. |
| 7,172,791 B2 | 2/2007 | Treadway et al. |
| 7,199,393 B2 | 4/2007 | Park et al. |
| 7,208,768 B2 | 4/2007 | Ono et al. |
| 7,332,211 B1 | 2/2008 | Bulovic et al. |
| 7,880,377 B2 | 2/2011 | Orita et al. |
| 2002/0146590 A1 | 10/2002 | Matsuo et al. |
| 2003/0034486 A1 | 2/2003 | Korgel |
| 2003/0035917 A1 | 2/2003 | Hyman |
| 2003/0042850 A1 | 3/2003 | Bertram et al. |
| 2003/0071794 A1 | 4/2003 | Arakawa et al. |
| 2003/0106488 A1 | 6/2003 | Huang et al. |
| 2003/0127659 A1 | 7/2003 | Bawendi et al. |
| 2003/0142944 A1 | 7/2003 | Sundar et al. |
| 2004/0023010 A1 | 2/2004 | Bulovic et al. |
| 2004/0091710 A1 | 5/2004 | Bawendi et al. |
| 2004/0110002 A1 | 6/2004 | Kim et al. |
| 2004/0137263 A1 | 7/2004 | Burn et al. |
| 2004/0227703 A1 | 11/2004 | Lamvik et al. |
| 2004/0265622 A1 | 12/2004 | Sadasivan et al. |
| 2005/0051769 A1 | 3/2005 | Jang et al. |
| 2005/0051777 A1 | 3/2005 | Hill |
| 2005/0072989 A1 | 4/2005 | Bawendi et al. |
| 2005/0088380 A1 | 4/2005 | Bulovic et al. |
| 2005/0112849 A1 | 5/2005 | Stott et al. |
| 2005/0116621 A1 | 6/2005 | Bellmann et al. |
| 2005/0116633 A1 | 6/2005 | Yamazaki et al. |
| 2005/0126628 A1 | 6/2005 | Scher et al. |
| 2005/0206306 A1 | 9/2005 | Perlo et al. |
| 2005/0214536 A1 | 9/2005 | Schrier et al. |
| 2005/0236556 A1 | 10/2005 | Sargent et al. |
| 2005/0258418 A1 | 11/2005 | Steckel et al. |
| 2005/0261400 A1 | 11/2005 | Yang et al. |
| 2005/0274944 A1 | 12/2005 | Jang et al. |
| 2005/0274994 A1 | 12/2005 | Rhodes |
| 2005/0276993 A1 | 12/2005 | Sohn et al. |
| 2005/0279989 A1 | 12/2005 | Li et al. |
| 2006/0034065 A1 | 2/2006 | Thurk |
| 2006/0043361 A1 | 3/2006 | Lee et al. |
| 2006/0046330 A1 | 3/2006 | Chen et al. |
| 2006/0060862 A1 | 3/2006 | Bawendi et al. |
| 2006/0063029 A1 | 3/2006 | Jang et al. |
| 2006/0157720 A1 | 7/2006 | Bawendi et al. |
| 2006/0196375 A1 | 9/2006 | Coe-Sullivan et al. |
| 2006/0198128 A1 | 9/2006 | Piepgras et al. |
| 2006/0204675 A1 | 9/2006 | Gao et al. |
| 2006/0232194 A1 | 10/2006 | Tung et al. |
| 2006/0236918 A1 | 10/2006 | Jun et al. |
| 2006/0273304 A1 | 12/2006 | Cok |
| 2007/0001581 A1 | 1/2007 | Stasiak et al. |
| 2007/0103068 A1 | 5/2007 | Bawendi et al. |
| 2007/0164661 A1 | 7/2007 | Kuma |
| 2007/0197003 A1 | 8/2007 | Yen et al. |
| 2007/0243382 A1 | 10/2007 | Chan et al. |
| 2007/0257608 A1 | 11/2007 | Tyan et al. |
| 2008/0001167 A1 | 1/2008 | Coe-Sullivan et al. |
| 2008/0029760 A1 | 2/2008 | Jun et al. |
| 2008/0074050 A1 | 3/2008 | Chen et al. |
| 2008/0150425 A1 | 6/2008 | Cho et al. |
| 2008/0169753 A1 | 7/2008 | Skipor et al. |
| 2008/0172197 A1 | 7/2008 | Skipor et al. |
| 2008/0180020 A1 | 7/2008 | Cok |
| 2008/0203895 A1 | 8/2008 | Miller et al. |
| 2008/0203899 A1 | 8/2008 | Miller et al. |
| 2008/0217602 A1 | 9/2008 | Kahen |
| 2008/0278063 A1 | 11/2008 | Cok |
| 2009/0001385 A1 | 1/2009 | Skipor et al. |
| 2009/0001403 A1 | 1/2009 | Skipor et al. |
| 2009/0002806 A1 | 1/2009 | Skipor et al. |
| 2009/0017268 A1 | 1/2009 | Skipor et al. |
| 2009/0059554 A1 | 3/2009 | Skipor et al. |
| 2009/0087546 A1 | 4/2009 | Ilzumi et al. |
| 2009/0152567 A1 | 6/2009 | Comerford et al. |
| 2009/0162011 A1 | 6/2009 | Coe-Sullivan et al. |
| 2009/0174022 A1 | 7/2009 | Coe-Sullivan et al. |
| 2009/0181478 A1 | 7/2009 | Cox et al. |
| 2009/0208753 A1 | 8/2009 | Coe-Sullivan et al. |
| 2009/0215208 A1 | 8/2009 | Coe-Sullivan et al. |
| 2009/0215209 A1 | 8/2009 | Anc et al. |
| 2009/0251759 A1 | 10/2009 | Domash et al. |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0283743 A1 | 11/2009 | Coe-Sullivan et al. |
| 2009/0283778 A1 | 11/2009 | Coe-Sullivan et al. |
| 2009/0286338 A1 | 11/2009 | Coe-Sullivan |
| 2009/0320909 A1 | 12/2009 | Arango et al. |
| 2010/0001256 A1 | 1/2010 | Coe-Sullivan et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051901 A1 | 3/2010 | Kazlas et al. |
| 2010/0068468 A1 | 3/2010 | Coe-Sullivan et al. |
| 2010/0132770 A1 | 6/2010 | Beatty et al. |
| 2010/0134520 A1 | 6/2010 | Coe-Sullivan et al. |
| 2010/0240901 A1* | 9/2010 | Bulovic et al. ............. 548/101 |
| 2010/0243053 A1 | 9/2010 | Coe-Sullivan et al. |
| 2010/0264371 A1 | 10/2010 | Nick |
| 2010/0265307 A1 | 10/2010 | Linton et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0314646 A1 | 12/2010 | Breen et al. |
| 2011/0025224 A1 | 2/2011 | Wood et al. |
| 2011/0080090 A1 | 4/2011 | Wood et al. |

(56) References Cited

U.S. PATENT DOCUMENTS

| | | |
|---|---|---|
| 2011/0081538 A1 | 4/2011 | Linton |
| 2011/0095261 A1 | 4/2011 | Kazlas et al. |
| 2011/0127932 A1 | 6/2011 | Halper et al. |

FOREIGN PATENT DOCUMENTS

| | | |
|---|---|---|
| JP | 10-270173 A | 10/1998 |
| JP | H11-040361 A | 2/1999 |
| JP | 02288188 A | 11/1999 |
| JP | 2000030859 | 1/2000 |
| JP | 2005101601 A | 4/2005 |
| JP | 2005340195 A | 12/2005 |
| JP | 2005353595 A | 12/2005 |
| JP | 2006066395 A | 3/2006 |
| JP | 2006186317 A | 7/2006 |
| WO | WO 2004/036961 A2 | 4/2004 |
| WO | WO 2004/036961 A3 | 4/2004 |
| WO | WO 2004/068584 | 8/2004 |
| WO | WO 2006/064896 | 6/2006 |
| WO | WO 2011/044391 | 4/2011 |
| WO | WO 2011/060180 | 5/2011 |

OTHER PUBLICATIONS

English Translation of Office Action, mailed Feb. 14, 2012, in counterpart Japanese Patent Application No. 2009-528269.

Murray, Christopher Bruce, MIT PhD Thesis, entitled "Synthesis and Characterization of II-VI Quantum Dots and Their Assembly into 3D Quantum dot Superlattices" Sep. 1993.

Yamasaki et al., Appl. Phys. Lett. 76, 1243 (2000).

Japanese Office Action dated Apr. 2, 2013, in counterpart Japanese Application No. 2009-528269 (Japanese).

Japanese Office Action dated Apr. 2, 2013, in counterpart Japanese Application No. 2009-528269 (English Transation).

Adachi, et al., "High-efficiency red eletrophosphorescence devices", Appl. Phys. Lett., 78, 1622 (2001).

Akimov, I.A., et al., "Semiconductor nanocrystals in a polymeric matrix: new optical media", Op. Spectrosc. 72(4), Apr. 1992, pp. 558 et seq.

Alivisatos, A.P., "Perspectives on the Physical Chemistry of Semiconductor Nanocrystals", J. Phys. Chem. vol. 100, No. 31 (1996), pp. 13226 et seq.

Alivisatos, A.P., "Semiconductor Clusters, Nanocrystals, and Quantum Dots", Science, New Series, vol. 271, No. 5251 (Feb. 16, 1996), 933-937.

Anikeeva, P.O., et al., "Photoluminescence of CdSe/ZnS core/shell quantum dots enhanced by energy transfer from a phosphorescent donor", Chem. Phys. Letters, 424 (2006) 120-125.

Anikeeva, P.O., et al., "Electroluminescence from a mixed red-green-blue colloidal quantum dot monolayer ", Nanoletters Published on Web Jul. 5, 20007.

Coe, S., et al., "Electroluminescence from single monolayers of nanocrystals in molecular organic devices", Nature, vol. 420, No. 6917, pp. 800-803 (2002).

Coe-Sullivan, S., et al., "Large-area Ordered Quantum-dot Monolayers via Phase Separation During Spin-Casting", Advanced Functional Materials, 15, 1117-1124 (2005).

Coe-Sullivan, S., et al., "Method for fabrication of saturated RGB quantum dot light emitting devices". Proc. of SPIE vol. 5739, pp. 108-115 (2005).

Coe-Sullivan, S, et al, "Tuning the performance of hybrid organic/inorganic quantum dot light-emitting devices", Organic Electronics 4 (2003) 123-130.

Dabbousi, B. O.,et al, << (CdSe)ZnS Core-Shell Quantum Dots : Synthesis and Characterization of a Size Series of Highly Luminescent Nanocrystallites >>, J. Phys. Chem., 101, 9463 (1997).

Dirr, S., et al., "Organic Light Emitting Diodes with Reduced Spectral and Spacial Halfwidths ", Jpn. J. Appl. Phys., 37, 1457 (1998).

Gao, M., << Lateral Patterning of CdTe Nanocrystal Films by the Electric Field Directed Layer-by-Layer Assembly Method >>, Langmuir, 2002, 4098-4102.

Jang, E., et al., "High quality CdSeS nanocrystals synthesized by facile single injection process and their electroluminescence", Chem. Commun, 2004, 2964-2965.

Kim, L., et al., "Contact Printing of Quantum Dot Light-Emitting Devices", Nano. Letters, vol. 8, No. 12, 4513-4517 (2008).

Kohli, N., et al., << Intact transfer of layered, bionanocomposite arrays by microcontact printing >>, Chem. Commun., 2005, 316-318.

Lee, T., "Organic light-emitting diodes formed by soft contact lamination", PNAS, Jan. 13, 2004, vol. 101, No. 2, 429-433.

Lin, X., et al., << Formation of Long-Range-Ordered Nanocrystal Superlattices on Silicon Nitride Substrates >>, J. Phys. Chem. B, 105, 3353-3357 (2001).

Mattoussi, H., et al., "Electroluminescence from heterostructures of poly(phenylene vinylene) and inorganic CdSe nanocrystals", J. Appl. Phys. vol. 83, No. 12 (1998), pp. 7965 et seq.

Meitl, M., et al., "Transfer printing by kinetic control of adhesion to an elastomeric stamp", Nature Materials, vol. 5, Jan. 2006, pp. 33 et seq.

Moeller, G., et l, "Quantum-dot light-emitting devices for displays", Information Display, Feb. 2006, pp. 2-6.

Murray, C.B., et al., "Synthesis and Characterization of Nearly Monodisperse CdE (E=S, Se, Te) Semiconductor Nanocrystallites", J. Am. Chem. Soc., 115:8706 (1993).

Olshavsky, Jet al., "Organometallic Synthesis of GaAs Crystallites Exhibiting Quantum Confinement", Am. Chem. Soc. (1990) 112, 9438-9439.

Santhanam, V., et al., "Self-Assembly of Uniform Monolayer Arrays of Nanoparticles", Langmuir, 19, 7881-7887 (2003).

Schlamp, M.C., et al., "Improved efficiencies in light emitting diodes made with CdSe(CdS) core/shell type nanocrystals and a semiconducting polymer", J. Appl. Phys., 82, 5837-5842 (1997).

Steckel, J.S., et al., "Color saturated green-emitting QD-LEDs", Agnew. Chem. Int. Ed., 2006, 45, 5796-5799.

Steckel, J.S., et al., "Blue luminescence from (CdS)ZnS Core-Shell Nanocrystals", Agnew. Chem. Int. Ed., 2004, 43, 2154-2158.

Steckel, J.S., et al., 1.3 μm to 1.55 μm Tunable Electroluminescence from PbSe Quantum Dots Embedded within an Organic Device, Adv. Mater., 2003, 15, No. 21 Nov. 4.

Tullo, Alexander H., "Printable electronics is attracting growing interest and is gearing up for commercial applications", Chemical & Engineering News, Feb. 13, 2006, vol. 84, No. 7, pp. 45-51.

PCT/US2007/19796 Written Opinion mailed Jul. 25, 2008.

Japanese Office Action dated Apr. 2, 2013, in counterpart Japanese Application No. 2009-528269.

3rd Office Action mailed Jun. 3, 2014 in Counterpart Japanese Patent Application No. 2009-528269.

* cited by examiner

ELECTROLUMINESCENT DISPLAY USEFUL FOR DISPLAYING A PREDETERMINED PATTERN

This application is a continuation of commonly owned PCT Application No. PCT/US2007/019796 filed 12 Sep. 2007, which was published in the English language as PCT Publication No. WO 2008/085210 on 17 Jul. 2008. The PCT Application claims priority from commonly owned U.S. application Ser. No. 60/825,370 filed 12 Sep. 2006. The disclosures of each of the foregoing applications are hereby incorporated herein by reference in their entireties.

TECHNICAL FIELD

The technical field of the invention relates to an electroluminescent display including semiconductor nanocrystals.

SUMMARY OF THE INVENTION

In accordance with one aspect of the invention there is provided an electroluminescent display comprising semiconductor nanocrystals, wherein the semiconductor nanocrystals are capable of emitting light at one or more predetermined wavelengths in a predetermined pattern.

In displaying brands and logos, the color or colors of the brands and/or logos are of particular interest to the owner of the brand and/or logo identified therewith. Semiconductor nanocrystal technology enables the preparation of emissive material that can be tuned to produce photons that emit a predetermined color. When multiple colors are desired, different populations of semiconductor nanocrystals, each prepared to emit one of the desired colors, will be used.

The predetermined pattern can be of any configuration or content. For example, the predetermined pattern can display any type of image (e.g., logo, design, picture, other graphics, text (e.g., letters, words, numbers, combinations of letter, words and/or numbers), and/or combinations thereof (e.g., a combination of a logo, design, picture, other graphics, and/or text).

In certain embodiments, the display further includes a controller which is configured to send electrical power to illuminate all or a pre-selected portion of the predetermined pattern area of the display, or lighting sequences. Exemplary lighting sequences include predetermined sequences and random sequences. In embodiments of a display including two or more predetermined patterns, the controller can be configured to send electrical power to illuminate all or pre-selected portions of the two or more predetermined patterns in predetermined lighting sequences or random lighting sequences. Controllers are well known. See, for example, U.S. Patent Application Publication No. 20060198128 of Piegras et al., the disclosure of which is hereby incorporated herein by reference.

Power may be provided to the electroluminescent display from an AC or DC power source.

Electroluminescent displays in accordance with the invention are particularly useful for displaying a predetermined pattern including one or more predetermined colors on an unlimited variety of products and other tangible objects and articles, including, but not limited to, windows, walls, buildings, signage, architectural structures, furniture, articles of clothing, clothing accessories, footwear, hats, headgear, jewelry, eye-glasses, sun-glasses, other eye-wear, luggage, handbags, brief cases, totes, automobiles, other motor, air, or water vehicles of any type, sports equipment, televisions, display screens, stereos, other sound equipment and peripherals, laptop computers, other computer hardware and peripherals, Compact Discs, DVDs, telephones, cell phones, handheld electronics (e.g., PDAs, MP3 players, IPOD® devices (IPOD is a registered trademark of Apple Computer, Inc.), books, bottles, consumer products, other products, product packaging, etc. Electroluminescent displays in accordance with the invention can optionally be fixedly or removably attached to an article for any purpose (including, but not limited to, branding, identification, warning, instructional or other informational and/or decorative purposes). Attachable displays can optionally further include a backing element attached to the back or non-viewing surface of the display. A backing element may comprise an adhesive, Velcro, or other conventional means for attaching the display to an article. When an adhesive is included on the back, a removable sheet of backing material or release paper can be further included. Such backing material or release paper overlies the adhesive and is loosely adhered thereto. In this embodiment, to mount the display, the backing material or release paper is removed and the adhesive backing is pressed against the surface on which the articles is to be attached or mounted.

The size of the display can be selected based on the end-use application.

In certain embodiments, at least a portion of the semiconductor nanocrystals may also generate light of one or more predetermined wavelengths in response to photo-excitation (e.g., natural light, artificial light, laser, etc.). At least a portion of the light that is absorbed by the semiconductor nanocrystals can be re-emitted as one or more photons of light, each at a predetermined wavelength. The emitted photons can be of the same or different wavelengths.

An electroluminescent display in accordance with the invention can include a backplane. The backplane includes active or passive electronics for controlling or switching power to individual pixels. In particular, the backplane can be configured as an active matrix, passive matrix, fixed format, direct drive, or hybrid. The display can be configured for still images, moving images, or lighting.

In certain embodiments, semiconductor nanocrystals are disposed in the display based on the wavelength of the light they emit to create a predetermined single color pattern. For example, the predetermined pattern can comprise semiconductor nanocrystals that are capable of generating light of the same predetermined wavelength in response to electrical excitation. In another example, the predetermined pattern can comprise a blend of semiconductor nanocrystals, the blend being capable of generating a single color light in response to electrical excitation. For example, the semiconductor nanocrystals can comprise a mixture including semiconductor nanocrystals capable of emitting red light, semiconductor nanocrystals capable of emitting green light, and semiconductor nanocrystals capable of emitting blue light in relative amounts selected to generate white light in response to electrical excitation.

In certain embodiments, semiconductor nanocrystals are disposed in the display based on the wavelength of the light they emit to create a predetermined multi-color pattern. For example, the predetermined pattern can comprise two or more different semiconductor nanocrystals wherein the wavelength emitted by each of the different semiconductor nanocrystals in response to electrical excitation is distinct from that emitted by the other different semiconductor nanocrystals.

In accordance with another aspect of the invention, an electroluminescent display comprises: a substrate; two electrodes disposed over the substrate; an active region including an emissive material comprising semiconductor nanocrystals disposed between the two electrodes, wherein the active region corresponds in size, shape, and location to at least the size, shape, and location of a predetermined pattern; and an insulating layer disposed between one of the electrodes and the active region, the insulating layer comprising an insulating material disposed to define the predetermined pattern by an area that is not covered by insulating material.

In certain embodiments, the active region can be disposed over the entire substrate.

In accordance with another aspect of the invention, an electroluminescent display comprises: a substrate; a first electrode disposed over the substrate; an insulating layer comprising an insulating material disposed over the first electrode and covering a portion of the first electrode so as to leave a portion of the first electrode not covered by insulating material in a predetermined pattern; an active region including an emissive material comprising semiconductor nanocrystals disposed over at least the portion of the first electrode not covered by the insulating layer; and a second electrode disposed over the active region and any portion of the insulating layer not covered by the active region.

In certain embodiments, the active region can be disposed over the entire substrate.

In another aspect of the invention, the order of the layers over the substrate can be inverted.

In accordance with another aspect of the invention, an electroluminescent display comprises: a substrate; a first electrode disposed over the substrate; an active region including an emissive material comprising semiconductor nanocrystals disposed over at least a portion of the first electrode, the active region corresponding in size, shape, and location to at least the size, shape, and location of a predetermined pattern; an insulating layer comprising the insulating material disposed over a portion of the active region and any portion of the first electrode not covered by the active region so as to leave a portion thereof not covered by insulating material in the predetermined pattern; and a second electrode disposed over the active region and any portion of the insulating layer not covered by the active region.

In certain embodiments, the active region can be disposed over the entire substrate.

In another aspect of the invention, the order of the layers over the substrate can be inverted.

In accordance with another aspect of the invention, an electroluminescent display comprises: a substrate; a conductive layer disposed over the substrate, the conductive layer comprising a first electrode disposed over the substrate and covering at least a portion of the substrate in a predetermined pattern, and an insulating material disposed over the portion of the substrate not covered by the first electrode; an active region including an emissive material comprising semiconductor nanocrystals disposed over at least the conductive layer, the semiconductor nanocrystals being selected and arranged in the active region to emit light at one or more predetermined wavelengths in accordance with the predetermined pattern; and a second electrode disposed over the emissive layer.

In certain embodiments, the active region can be disposed over the entire substrate.

In another aspect of the invention, the order of the layers over the substrate can be inverted.

In accordance with another aspect of the invention, an electroluminescent display comprises: a substrate; a first electrode disposed on the substrate; a layer comprising an active region comprising an emissive material comprising semiconductor nanocrystals disposed over the first electrode and covering at least a portion of the substrate in a predetermined pattern, the semiconductor nanocrystals being selected and arranged to emit light at one or more predetermined wavelengths in accordance with the predetermined pattern, and an insulating material disposed over the portion of the first electrode not covered by the predetermined pattern comprising semiconductor nanocrystals; and a second electrode disposed over the emissive layer.

In another aspect of the invention, the order of the layers over the substrate can be inverted.

In another aspect of the invention, the electroluminescent display further includes backplane circuitry in electrical connection with one of the electrodes.

In certain embodiments, the semiconductor nanocrystals comprise a core/shell structure.

In accordance with a still further aspect of the invention, there is provided an electroluminescent display comprising semiconductor nanocrystals, wherein the semiconductor nanocrystals are capable of emitting light at one or more predetermined wavelengths in one or more predetermined patterns, each pattern being separately addressable. In one embodiment, each pattern is addressable to enable each of the predetermined patterns to be separately displayed. In another embodiment, each pattern is addressable to enable more than one of the predetermined patterns to be displayed at the same time.

In accordance with yet another aspect of the invention, there is provided an electroluminescent display comprising semiconductor nanocrystals, wherein the semiconductor nanocrystals are capable of emitting light at one or more predetermined wavelengths in one or more predetermined patterns, at least a portion of the semiconductor nanocrystals being capable of generating light of one or more predetermined wavelengths in response to ambient lighting without requiring additional stimulation and at least some of the semiconductor nanocrystals are capable of generating light of one or more predetermined wavelengths in response to electrical excitation.

In accordance with still further aspects of the invention, various applications of articles in accordance with the invention are provided.

The foregoing, and other aspects described herein all constitute embodiments of the invention.

It is to be understood that both the foregoing general description and the following detailed description are exemplary and explanatory only and are not restrictive of the invention as claimed. Other embodiments will be apparent to those skilled in the art from consideration of the description, from the claims, and from practice of the invention disclosed herein.

BRIEF DESCRIPTION OF THE DRAWINGS

In the drawings.

The attached figures are simplified representations presented for purposes of illustration only; the actual structures may differ in numerous respects, including, e.g., relative scale, etc.

For a better understanding to the invention, together with other advantages and capabilities thereof, reference is made to the following disclosure and appended claims in connection with the above-described drawings.

DETAILED DESCRIPTION OF THE INVENTION

Figure 1:
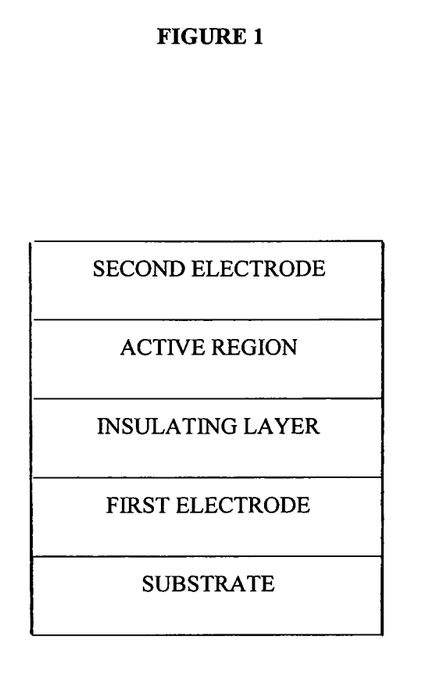
FIG. 1 is schematic drawing depicting a cross-section of the structure of an example of an embodiment of an electroluminescent display in accordance with the invention.

FIG. 1 provides a drawing of a cross-section of an example of an electroluminescent display in accordance with the present invention. The depicted example includes a first electrode disposed over a substrate; an insulating layer comprising an insulating material disposed over the first electrode and covering a portion of the first electrode so as to leave a portion of the first electrode not covered by insulating material in a predetermined pattern; an active region including an emissive material comprising semiconductor nanocrystals disposed over at least the portion of the first electrode not covered by the insulating layer; and a second electrode disposed over the active region and any portion of the insulating layer not covered by the active region.

The active region may further comprise a first layer and a second layer (not shown). The first layer can comprise a material capable of transporting holes (HTL) and the second layer can comprise a material capable of transporting electrons (ETL). At least one layer can be non-polymeric. The semiconductor nanocrystals can be disposed within the first layer or the second layer, or between the first and second layers as one or more layers. When the emissive material is disposed as a layer, it can have a thickness of less than about one, about one, or more than about one monolayer of semiconductor nanocrystals. In certain embodiments, additional materials (e.g., charge transport material, charge injection material (e.g., PEDOT/PSS, etc.) may also be included in the active region. In the embodiment depicted in FIG. 1 the first electrode of the structure is in contact with the substrate. Each electrode can be connected to a power supply to provide a voltage across the structure. Electroluminescence can be produced by the semiconductor nanocrystals included in the display when a voltage of proper polarity and magnitude is applied across the heterostructure.

As described above, in certain embodiments, the first layer of the active region can include an emissive material comprising semiconductor nanocrystals. In certain embodiments, the semiconductor nanocrystals comprise a substantially monodisperse population of semiconductor nanocrystals.

The display structure depicted in FIG. 1 may be fabricated as follows. A substrate having a first electrode (e.g., an anode) disposed thereon may be obtained or fabricated using any suitable technique. The first electrode may be patterned. An insulating layer may be deposited using any suitable technique. An active region including an emissive material comprising semiconductor nanocrystals can be deposited by contact printing, inkjet printing, or other techniques known or readily identified by one skilled in the relevant art. When a first layer is included in the active region, the first layer (e.g., comprising a material capable of transporting holes) may be deposited using any suitable technique. When a second layer is included in the active region, the second layer (e.g., comprising a material capable of transporting electrons) may be deposited using any suitable technique. A second electrode (e.g., a cathode) may be deposited using any suitable technique.

In the example shown in FIG. 1, light is emitted from the bottom of the display. If an adequately light transmissive top electrode is used, the structure could also emit light from the top of the structure, and be highly (e.g., greater than about 50%) transparent.

Alternatively, the structure of FIG. 1 can be inverted, in which case light can be emitted from the top.

The simple layered structure illustrated in FIG. 1 is provided by way of non-limiting example, and it is understood that embodiments of the invention may be used in connection with a wide variety of other structures. Embodiments of the invention can optionally further include additional materials and/or layers (patterned or unpatterned), preferably transparent, disposed under and/or over the predetermined pattern. The specific materials and structures described herein are exemplary in nature, and other materials and structures may be used. Functional displays may be achieved by combining the various layers described in different ways, or layers may be omitted entirely, based on design, performance, and cost factors. Other layers not specifically described may also be included. Materials other than those specifically described may be used. Examples of such materials and/or layers include electrode materials, charge transport materials, charge injection materials, and/or charge blocking materials. These are well known to persons having ordinary skill the relevant field. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Optionally, one or more of the layers besides the insulating layer can be patterned. For example, patterned layers (other than the emissive layer) of vapor deposited materials can be deposited by vapor deposition using shadow masks or other masking techniques. Patterned layers of solution processible materials can be deposited using contact printing, inkjet printing, screen-printing, etc.

Figure 2:
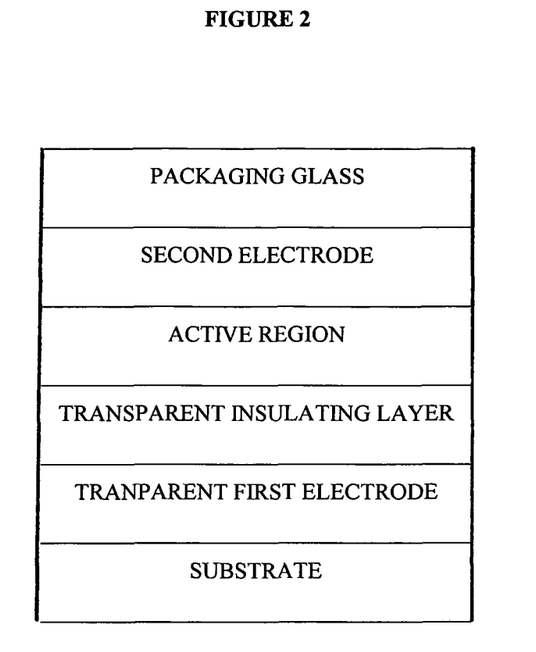
FIG. 2 is schematic drawing depicting a cross-section of the structure of an example of an embodiment of an electroluminescent display in accordance with the invention.

FIG. 2 illustrates an example of a cross-section of the structure of another embodiment of a display showing a glass substrate on which the display can be built and a protective glass layer that can be used to encapsulate the display. Optionally a desiccant or other moisture absorptive material can be included in the display before it is sealed, e.g., with an epoxy, such as a UV curable epoxy. Other desiccants or moisture absorptive materials can be used.

The color of the light output of the display can be precisely controlled by the selection of the composition, structure, and size of the various semiconductor nanocrystals included in the active region of a display as an emissive material. In certain embodiments, two or more different semiconductor nanocrystals (having different compositions, structures, and/ or sizes) can be included.

An example of a technique for depositing an emissive material comprising semiconductor nanocrystals in a pattern and/or in a multi-color pattern or other array is contact printing. Contact printing advantageously allows micron-scale (e.g., less than 1 mm, less than 500 microns, less than 200 microns, less than 100 microns, less than 50 microns, less than 25 microns, or less than 10 microns) patterning of features on a surface. Pattern features can also be applied at larger scales, such as 1 mm or greater, 1 cm or greater, 1 m of greater, 10 m or greater. Contact printing can allow dry (e.g., liquid free or substantially liquid free) application of a patterned semiconductor nanocrystal layer to a surface. In a pixilated display, the semiconductor nanocrystal layer comprises a patterned array of the semiconductor nanocrystals on the underlying layer. In instances where a pixel includes subpixels, the sizes of the subpixels can be a proportionate fraction of the pixel size, based on the number of subpixels.

Semiconductor nanocrystals can be dispersed in a liquid medium and are therefore compatible with thin-film deposition techniques such as spin-casting, drop-casting, and dip coating.

Preferably, semiconductor nanocrystals are deposited in the display using contact printing. This approach can also facilitate a substantially dry (i.e., substantially liquid or solvent free) application of a patterned semiconductor nanocrystal film in a display, thus freeing the surface of solubility and surface chemistry requirements.

The semiconductor nanocrystals can alternatively be deposited by other solution based processing techniques, e.g., silk-screening, inkjet and other liquid film techniques available for forming patterns on a surface.

Additional information and methods for depositing semiconductor nanocrystals are described in U.S. patent application Ser. No. 11/253,612 entitled "Method And System For Transferring A Patterned Material", filed 21 Oct. 2005, and U.S. patent application Ser. No. 11/253,595 entitled "Light Emitting Device Including Semiconductor Nanocrystals", filed 21 Oct. 2005, each of which is hereby incorporated herein by reference in its entirety.

Other techniques, methods and applications that may be useful with the invention are described in, U.S. Provisional Patent Application No. 60/792,170, of Seth Coe-Sullivan, et al., for "Composition Including Material, Methods Of Depositing Material, Articles Including Same And Systems For Depositing Material", filed on 14 Apr. 2006; U.S. Provisional Patent Application No. 60/792,084, of Maria J. Anc, For "Methods Of Depositing Material, Methods Of Making A Device, And System", filed on 14 Apr. 2006, U.S. Provisional Patent Application No. 60/792,086, of Marshall Cox, et al, for "Methods Of Depositing Nanomaterial & Methods Of Making A Device" filed on 14 Apr. 2006; U.S. Provisional Patent Application No. 60/792,167 of Seth Coe-Sullivan, et al, for "Articles For Depositing Materials, Transfer Surfaces, And Methods" filed on 14 Apr. 2006, U.S. Provisional Patent Application No. 60/792,083 of LeeAnn Kim, et al., for "Applicator For Depositing Materials And Methods" filed on 14 Apr. 2006; U.S. Provisional Patent Application 60/793,990 of LeeAnn Kim. et al., for "Applicator For Depositing Materials And Methods" filed on 21 Apr. 2006; U.S. Provisional Patent Application No. 60/790,393 of Seth Coe-Sullivan. et al., for "Methods And Articles Including Nanomaterial", filed on 7 Apr. 2006; U.S. Provisional Patent Application No. 60/805,735 of Seth Coe-Sullivan, for "Methods For Depositing Nanomaterial, Methods For Fabricating A Device, And Methods For Fabricating An Array Of Devices", filed on 24 Jun. 2006; U.S. Provisional Patent Application No. 60/805,736 of Seth Coe-Sullivan et al., for "Methods For Depositing Nanomaterial, Methods For Fabricating A Device, Methods For Fabricating An Array Of Devices And Compositions", filed on 24 Jun. 2006; U.S. Provisional Patent Application No. 60/805,738 of Seth Coe-Sullivan, et al., for "Methods And Articles Including Nanomaterial", filed on 24 Jun. 2006; U.S. Provisional Patent Application No. 60/795,420 of Paul Beatty, et al., for "Device Including Semiconductor Nanocrystals And A Layer Including A Doped Organic Material And Methods", filed on 27 Apr. 2006; U.S. Provisional Patent Application No. 60/804,921 of Seth Coe-Sullivan, et al., for "Light-Emitting Devices And Displays With Improved Performance", filed on 15 Jun. 2006, and U.S. patent application Ser. No. 11/071,244 of Jonathan S. Steckel, et al., for "Blue Light Emitting Semiconductor Nanocrystal Materials" filed on 4 Mar. 2005 (including U.S. patent application Ser. No. 60/550,314, filed on 8 Mar. 2004, from which it claims priority). See also, PCT Publication No. WO 2004/068584 of Englehardt, et al. for "Light Emitting Device". The disclosures of each of the foregoing listed provisional patent applications are hereby incorporated herein by reference in their entireties.

Other multilayer structures may optionally be used to improve the performance (see, for example, U.S. patent application Ser. No. 10/400,907 and U.S. patent application Ser. No. 10/400,908, filed Mar. 28, 2003, each of which is incorporated herein by reference in its entirety) of the displays of the invention.

Because semiconductor nanocrystals have narrow emission linewidths, are photoluminescent efficient, and emission wavelength tunable with the size and/or composition of the nanocrystals, they are desirable for inclusion in emissive materials for use in the invention.

The size and composition of the semiconductor nanocrystals can be selected such that semiconductor nanocrystals emit photons at a predetermined wavelength of wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

For example, as discussed above, the predetermined pattern can include semiconductor nanocrystals that emit light at the same or different wavelengths. By including an arrangement the semiconductor nanocrystals that emit light at different wavelengths, a multicolor pattern can be formed. The semiconductor crystals can display a pattern that is single color, multi-color, and/or white.

In a monochromatic embodiment, the semiconductor nanocrystals included in the active region are selected to be capable of emitting light at a predetermined wavelength or wavelength band upon excitation. In certain embodiments, the semiconductor nanocrystals can comprise a single population of semiconductor nanocrystals that is capable of emitting light at a single predetermined wavelength or wavelength band output upon excitation. In certain embodiments, the semiconductor nanocrystals can comprise two or more populations of semiconductor nanocrystals, at least two of which are capable of emitting light at predetermined wavelengths or wavelength bands upon excitation that are distinct from that of the other, wherein the two or more populations of semiconductor nanocrystals are mixed together in relative proportionate amounts such that the mixture is capable of emitting light at a single predetermined wavelength or wavelength band upon excitation.

In a multi-color or polychromatic embodiment, for example, the semiconductor nanocrystals can comprise two or more populations of semiconductor nanocrystals wherein at least two of the populations are capable of emitting light at predetermined wavelengths or wavelength bands upon excitation that are distinct from each other. One or more of the populations of semiconductor nanocrystals can further comprise two or more subpopulations of semiconductor nanocrystals, at least two of which are capable of emitting light at predetermined wavelengths or wavelength bands upon excitation that are distinct that of the other, wherein the two or more subpopulations of semiconductor nanocrystals are mixed together in relative proportionate amounts such that the population comprising the mixture of subpopulations is capable of emitting light at a single predetermined wavelength or wavelength band upon excitation. The two or more populations of semiconductor nanocrystals that are capable of emitting light at distinct wavelengths or wavelength bands can further be arranged according to the wavelength or wavelength band of their respective emissions in accordance with the predetermined pattern.

Semiconductor nanocrystals are nanometer-scale inorganic semiconductor particles. Semiconductor nanocrystals included in the article of the invention preferably have an average nanocrystal diameter less than about 150 Angstroms (Å), and most preferably in the range of 12-150 Å.

However, depending upon the composition and desired emission wavelength of the semiconductor nanocrystal, the average diameter may be outside of these various preferred size ranges.

Semiconductor nanocrystals include, for example, inorganic crystallites between about 1 nm and about 1000 nm in diameter, preferably between about 2 nm and about 50 um, more preferably about 5 nm to about 20 nm (such as about 6, 7, 8, 9, 10, 11, 12, 13, 14, 15, 16, 17, 18, 19, or 20 nm).

A semiconductor material included in a semiconductor nanocrystal can be represented by the formula Mx. In certain examples M comprises, for example, one or more elements from Group IA element (for example, lithium, sodium, rubidium, and cesium), Group IIA (for example, beryllium, magnesium, calcium, strontium, and barium), Group IIB (for example, Zn, Cd, or Hg), Group IIIA (for example, Al, Ga, In or Ti), Group IVA (for example, Si, Ge, Sn or Pb), and/or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, X comprises one or more elements from Group VA (for example, nitrogen, phosphorus, arsenic, antimony, and bismuth) and/or Group VIA (for example, oxygen, sulfur, selenium, and tellurium).

More detailed examples of materials suitable for inclusion in a semiconductor nanocrystal core include, but are not limited to, CdO, CdS, CdSe, CdTe, ZnO, ZnS, ZnSe, ZnTe, MgTe, GaAs, GaP, GaSb, GaN, HgO, HgS, HgSe, HgTe, InAs, InP, InSb, InN, AlAs, AlP, AlSb, AlN, PbO, PbS, PbSe, TlN, TlP, TlAs, TlSb, Ge, Si, an alloy including one or more of foregoing, and/or a mixture including one or more of the foregoing.

Semiconductor material included in semiconductor nanocrystals may alternatively be represented by a formula based on the group(s) of the Period Table of Elements in which the elemental component(s) of the material is found, for example, as a Group IVA element, a Group IIB-VIA compound, a Group IIB-VA compound, a Group IIIA-VIA compound, a Group IIIA-VA compound, a Group IVA-VIA compound, a Group IA-IIIA-VIA compound, a Group IIB-IVA-VIA compound, or a Group IIB-IVA-VA compound, an alloy including one or more of foregoing, and/or a mixture including one or more of the foregoing, including ternary and quaternary mixtures or alloys.

Examples of the shape of the semiconductor nanocrystals include sphere, rod, disk, other shape or mixtures thereof.

Preferably, the semiconductor nanocrystals preferably include a "core" of one or more first semiconductor materials, which may be surrounded by an overcoating or "shell" of a second semiconductor material. A semiconductor nanocrystal core surrounded by a semiconductor shell is also referred to as a "core/shell" semiconductor nanocrystal.

For example, a semiconductor nanocrystal core can comprise any of the semiconductor materials described above.

A shell can comprise a semiconductor material having a composition that is the same as or different from the composition of the core. The shell comprises an overcoat of a semiconductor material on at least a portion of the surface of the core. Examples include any of the semiconductor materials listed above.

For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness of from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell.

The semiconductor nanocrystals included in the emissive material are preferably members of one or more populations of semiconductor nanocrystals having a narrow size distribution. In certain embodiments, at least one of the populations of semiconductor nanocrystals comprises a monodisperse or substantially monodisperse population of semiconductor nanocrystals. In certain embodiments, each population of semiconductor nanocrystals comprises a monodisperse or substantially monodisperse population of semiconductor nanocrystals.

Semiconductor nanocrystals show strong quantum confinement effects that can be harnessed in designing bottom-up chemical approaches to create complex heterostructures with electronic and optical properties that are tunable with the size and composition of the nanocrystals.

Examples of preparation and manipulation of semiconductor nanocrystals are described, for example, in U.S. Pat. Nos. 6,322,901 and 6,576,291, and U.S. patent application Ser. No. 60/550,314, each of which is hereby incorporated herein by reference in its entirety. One method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals obtained has a narrow, monodisperse distribution of diameters. The monodisperse distribution of diameters can also be referred to as a size. Preferably, a monodisperse population of particles includes a population of particles wherein at least 60% of the particles in the population fall within a specified particle size range. A population of monodisperse particles preferably deviate less than 15% rms (root-mean-square) in diameter and more preferably less than 10% rms and most preferably less than 5%.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated herein by reference in their entireties.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-noctylphosphine) sulfide (TOPS), an ammonium salt such as an ammonium halide (e.g., NH4Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Examples of suitable coordinating solvents include pyridine, tri-n-octyl phosphine (TOP), tri-n-octyl phosphine oxide (TOPO) and trishydroxylpropylphosphine (tHPP). Technical grade TOPO can be used.

In another embodiment, a non-coordinating solvent can be used. Examples of suitable non-coordinating solvents include, but are not limited to, octadecene, squalane, squalene, octadecane, dioctyl ether, diphenyl ether, methyl myristate, octyl octanoate, hexyl octanoate, and octadecylamine.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for ZnS, CdSe, CdTe, PbSe, and InSb, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm. By stopping growth at a particular semiconductor nanocrystal average diameter, a population having an average semiconductor nanocrystal diameter of less than 150 Å can be obtained. A population of semiconductor nanocrystals can have an average diameter of 15 Å to 125 Å.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

In certain embodiments, the semiconductor nanocrystals optionally have ligands attached thereto.

In one embodiment, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal.

More specifically, the coordinating ligand can have the formula:

wherein k is 2, 3 4, or 5, and n is 1, 2, 3, 4 or 5 such that k-n is not less than zero; X is O, O—S, O—Se, O—N, O—P, O—As, S, S=O, SO2, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, Advanced Organic Chemistry, which is incorporated herein by reference in its entirety.

See also U.S. patent application Ser. No. 10/641,292 entitled "Stabilized Semiconductor Nanocrystals", filed 15 Aug. 2003, which is hereby incorporated herein by reference in its entirety.

When an electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of semiconductor nanocrystals shift to the blue, or to higher energies, as the size of the crystallites decreases.

For an example of blue light-emitting semiconductor nanocrystal materials, see U.S. patent application Ser. No. 11/071,244, filed 4 Mar. 2005, which is hereby incorporated by reference herein in its entirety.

The emission from the semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region. The narrow size distribution of a population of semiconductor nanocrystals can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. Spectral emissions in a narrow range of no greater than about 75 nm, preferably 60 nm, more preferably 40 nm, and most preferably 30 nm full width at half max (FWHM) for semiconductor nanocrystals that emit in the visible can be observed. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of semiconductor nanocrystal diameters decreases. Semiconductor nanocrystals can have high emission quantum efficiencies such as greater than 10%, 20%, 30%, 40%, 50%, 60%, 70%, or 80%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

The first electrode can be, for example, an anode comprising a high work function (e.g., greater than 4.0 eV) hole-injecting conductor, such as an indium tin oxide (ITO) layer. Other anode materials include other high work function hole-injection conductors including, but not limited to, for example, tungsten, nickel, cobalt, platinum, palladium and their alloys, gallium indium tin oxide, zinc indium tin oxide, titanium nitride, polyaniline, or other high work function hole-injection conducting polymers. In certain embodiments, the first electrode is light transmissive or transparent. In addition to ITO, examples of other light-transmissive electrode materials include conducting polymers, and other metal oxides, low or high work function metals, conducting epoxy resins, or carbon nanotubes/polymer blends or hybrids that are at least partially light transmissive. An example of a conducting polymer that can be used as an electrode material is poly(ethlyendioxythiophene), sold by Bayer AG under the trade mark PEDOT. Other molecularly altered poly (thiophenes) are also conducting and could be used, as well as emaraldine salt form of polyaniline.

The second electrode can be, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride—aluminum (LiF:Al). The second electrode, such as Mg:Ag, can optionally be covered with an opaque protective metal layer, for example, a layer of Ag for protecting the cathode layer from atmospheric oxidation, or a relatively thin layer of substantially transparent ITO. The second electrode can be sandwiched, sputtered, or evaporated onto the exposed surface of the solid layer. One or both of the electrodes can be patterned. The electrodes of the display can be connected to a voltage source by electrically conductive pathways. Upon application of the voltage, light is generated from the display.

In a display such as that shown in FIG. 1, for example, the first electrode can have a thickness of about 500 Angstroms to 4000 Angstroms. The second electrode can have a thickness of about 5 Angstroms to greater than about 10,000 Angstroms.

Non-polymeric electrode materials can be deposited by, for example, sputtering or evaporating. Polymeric electrode materials can be deposited by, for example, spin-casting.

As discussed above, in certain embodiments, the electrodes can be disposed in a predetermined pattern. Electrode material, including light-transmittable electrode material, can be patterned by, for example, a chemical etching method such as a photolithography or a physical etching method using laser, etc. Also, the electrode may be patterned by vacuum vapor deposition, sputtering, etc. while masking.

Insulating material that can be included in the insulating layer can be organic or inorganic. Examples of suitable inorganic insulating materials include undoped oxides. Silica is a more detailed example. Examples of suitable organic insulating materials include organic materials having a bandgap greater than about 3 eV. More detailed examples include polymethyl methacrylate (PMMA) and polystyrene. Other suitable insulating materials can be readily identified by a person of ordinary skill in the art. These materials can be deposited by known techniques. These materials can also be patterned by known techniques.

Hole transport and electron transport layer that can optionally be included in the active region can be collectively referred to as charge transport layers. Either or both of these layers can comprise organic or inorganic materials. Examples of inorganic material include, for example, inorganic semiconductors. The inorganic material can be amorphous or polycrystalline. An organic charge transport material can be polymeric or non-polymeric.

An example of a typical organic material that can be included in an electron transport layer includes a molecular matrix. The molecular matrix can be non-polymeric. The molecular matrix can include a small molecule, for example, a metal complex. The metal complex of 8-hydoryquinoline can be an aluminum, gallium, indium, zinc or magnesium complex, for example, aluminum tris(8-hydroxyquinoline) ($Alq_3$). Examples of electron transport materials also include material ETL/HBL Material LT-N820 available from Luminescent Technologies, Taiwan. Other classes of materials in the electron transport layer can include metal thioxinoid compounds, oxadiazole metal chelates, triazoles, sexithiophenes derivatives, pyrazine, and styrylanthracene derivatives. An electron transport layer comprising an organic material may be intrinsic (undoped) or doped. Doping may be used to enhance conductivity. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

An examples of a typical organic material that can be included in a hole transport layer includes an organic chromophore. The organic chromophore can include a phenyl amine, such as, for example, N,N'-diphenyl-N,N'-bis(3-mehtylphenyl)-(1,1'-biphenyl)-4,4'-diamine (TPD). Other hole transport layer can include spiro-TPD, 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N,N',N'-tetraarylbenzidine. A hole transport layer comprising an organic material may be intrinsic (undoped) or doped. Doping may be used to enhance conductivity. Examples of doped hole transport layers are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

Charge transport layers comprising organic materials and other information related to fabrication of organic charge transport layers are discussed in more detail in U.S. patent application Ser. No. 11/253,612 for "Method And System For Transferring A Patterned Material", filed 21 Oct. 2005, and U.S. patent application Ser. No. 11/253,595 for "Light Emitting Device Including Semiconductor Nanocrystals", filed 21 Oct. 2005. The foregoing patent applications are hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions of from about $1 \times 10^{-7}$ to about $5 \times 10^{-6}$ torr. Alternatively, organic layers may be formed by multi-layer coating while appropriately selecting solvent for each layer.

Charge transport layers including inorganic materials and other information related to fabrication of inorganic charge transport layers are discussed further below and in more detail in U.S. patent application Ser. No. 60/653,094 for "Light Emitting Device Including Semiconductor Nanocrystals", filed 16 Feb. 2005 and U.S. patent application Ser. No. 11/354,185, filed 15 Feb. 2006, the disclosures of each of which are hereby incorporated herein by reference in their entireties.

Charge transport layers comprising an inorganic semiconductor can be deposited at a low temperature, for example, by a known method, such as a vacuum vapor deposition method, an ion-plating method, sputtering, inkjet printing, etc.

In addition to the charge transport layers, an active region of the display may optionally further include one or more charge-injection layers, e.g., a hole-injection layer (either as a separate layer or as part of the hole transport layer) and/or an electron-injection layer (either as a separate layer as part of the electron transport layer). Charge injection layers comprising organic materials can be intrinsic (un-doped) or doped. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

One or more charge blocking layers may still further optionally be included. For example, an electron blocking layer (EBL), a hole blocking layer (HBL), or an exciton blocking layer (eBL), can be introduced in the structure. A blocking layer can include, for example, 3-(4-biphenylyl)-4-phenyl-5-tert butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-Nphenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tertbutylphenyl)-1,3,4-oxadiazole, 1,3-bis[5-(4-(1,1-dimethylethyl)phenyl)-1,3,4-oxadiazol-5,2-yl)benzene, 1,4-bis(5-(4-diphenylamino)

phenyl-1,3,4-oxadiazol-2-yl)benzene, 1,3,5-tris[5-(4-(1,1-dimethylethyl)phenyl)-1,3,4-oxadiazol-2-yl)benzene, or 2,2',2''-(1,3,5-Benzinetriyl)-tris(1-phenyl-1-H-benzimidazole) (TBPi).

Charge blocking layers comprising organic materials can be intrinsic (un-doped) or doped. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

The charge injection layers (if any), and charge blocking layers (if any) can be deposited on a surface of one of the electrodes by spin coating, dip coating, vapor deposition, or other thin film deposition methods. See, for example, M. C. Schlamp, et al., J. Appl. Phys., 82, 5837-5842, (1997); V. Santhanam, et al., Langmuir, 19, 7881-7887, (2003); and X. Lin, et al., J. Phys. Chem. B, 105, 3353-3357, (2001), each of which is incorporated by reference in its entirety.

Other multilayer structures may optionally be used to improve the performance (see, for example, U.S. patent application Ser. Nos. 10/400,907 and 10/400,908, filed Mar. 28, 2003, each of which is incorporated by reference in its entirety) of the displays of the invention. The performance of displays can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety.

Preferably, a display including semiconductor nanocrystals is processed in a controlled (oxygen-free and moisture-free) environment, preventing the quenching of luminescent efficiency during the fabrication process.

The substrate can be opaque, light transmissive, or transparent. The substrate can be rigid or flexible. The substrate can comprise plastic, metal, glass, or semiconductor (e.g., silicon).

In another embodiment of the invention, the electroluminescent display further includes a cover, coating or layer over at least the portion of the surface upon which the predetermined pattern of semiconductor nanocrystals are disposed to protect the nanocrystals from the environment (e.g., dust, moisture, and the like) and/or scratching or abrasion. In a further embodiment, the cover can further optionally include a lens, prismatic surface, etc. Anti-reflection, light polarizing, and/or other coatings can also optionally be included over the pattern.

As used herein, "top" and "bottom" are relative positional terms, based upon a location from a reference point. More particularly, "top" means farthest away from the substrate, while "bottom" means closest to the substrate. For example, for a display including two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface farther away from the substrate. Where, e.g., a first layer is described as disposed or deposited "over" a second layer, the first layer is disposed farther away from substrate. There may be other layers between the first and second layer, unless it is otherwise specified. For example, a cathode may be described as "disposed over" an anode, even though there are various organic and/or inorganic layers in between. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and equivalents thereof.

What is claimed is:

1. An electroluminescent display comprising: a substrate; a first electrode disposed over the substrate; an insulating layer comprising an insulating material disposed over the first electrode and covering a portion of the first electrode so as to leave a portion of the first electrode not covered by insulating material in a predetermined pattern; an active region including an emissive material comprising semiconductor nanocrystals disposed over at least the portion of the first electrode not covered by the insulating layer; and a second electrode disposed over the active region and any portion of the insulating layer not covered by the active region.

2. An electroluminescent display in accordance with claim 1 wherein order of the insulating layer and active region is inverted.

3. An electroluminescent display in accordance with claim 1 further including backplane circuitry in electrical connection with one of the electrodes.

4. An electroluminescent display in accordance with claim 1 wherein the semiconductor nanocrystals comprise a core/shell structure.

5. An electroluminescent display comprising: a substrate; a first electrode disposed over the substrate; an active region including an emissive material comprising semiconductor nanocrystals disposed over at least a portion of the first electrode, the active region corresponding in size, shape, and location to at least the size, shape, and location of a predetermined pattern; an insulating layer comprising the insulating material disposed over a portion of the active region and any portion of the first electrode not covered by the active region so as to leave a portion thereof not covered by insulating material in the predetermined pattern; and a second electrode disposed over the active region and any portion of the insulating layer not covered by the active region.

6. An electroluminescent display in accordance with claim 5 wherein order of the active region and insulating layer is inverted.

7. An electroluminescent display in accordance with claim 5 further including backplane circuitry in electrical connection with one of the electrodes.

8. An electroluminescent display in accordance with claim 5 wherein the semiconductor nanocrystals comprise a core/shell structure.

9. An electroluminescent display comprising: a substrate; a conductive layer disposed over the substrate, the conductive layer comprising a first electrode disposed over the substrate and covering at least a portion of the substrate in a predetermined pattern, and an insulating material disposed over the portion of the substrate not covered by the first electrode; an active region including an emissive material comprising semiconductor nanocrystals disposed over at least the conductive layer, the semiconductor nanocrystals being selected and arranged in the active region to emit light at one or more predetermined wavelengths in accordance with the predetermined pattern; and a second electrode disposed over the emissive layer.

10. An electroluminescent display in accordance with claim 9 further including backplane circuitry in electrical connection with one of the electrodes.

11. An electroluminescent display in accordance with claim 9 wherein order of the first electrode, insulating layer, active region, and second electrode over the substrate is inverted.

12. An electroluminescent display in accordance with claim 9 wherein the semiconductor nanocrystals comprise a core/shell structure.

13. An electroluminescent display comprising: a substrate; a first electrode disposed on the substrate; a patterned emissive layer disposed over the first electrode, a layer comprising an active region comprising an emissive material comprising semiconductor nanocrystals disposed over the first electrode and covering at least a portion of the substrate in a predetermined pattern, the semiconductor nanocrystals being selected and arranged to emit light at one or more predetermined wavelengths in accordance with the predetermined pattern, and an insulating material disposed over the portion of the first electrode not covered by the predetermined pattern comprising semiconductor nanocrystals; and a second electrode disposed over the emissive layer.

14. An electroluminescent display in accordance with claim 13 further including backplane circuitry in electrical connection with one of the electrodes.

15. An electroluminescent display in accordance with claim 13 wherein order of the first electrode; active region; insulating layer, and second electrode over the substrate is inverted.

16. An electroluminescent display in accordance with claim 13 wherein the semiconductor nanocrystals comprise a core/shell structure.

17. An electroluminescent display in accordance with claim 13 further including backplane circuitry in electrical connection with one of the electrodes.

18. An electroluminescent display in accordance with claim 13 wherein the semiconductor nanocrystals comprise a core/shell structure.

* * * * *